United States Patent
Kanai et al.

(10) Patent No.: US 6,490,781 B2
(45) Date of Patent: Dec. 10, 2002

(54) COMPONENT MOUNTING MACHINE AND SAFETY DEVICE THEREOF

(75) Inventors: Kazunori Kanai, Kofu (JP); Naoto Mimura, Yamanashi-ken (JP); Yuji Miyata, Kofu (JP); Akira Kabeshita, Hirakata (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 0 days.

(21) Appl. No.: 09/989,521

(22) Filed: Nov. 21, 2001

(65) Prior Publication Data

US 2002/0029466 A1 Mar. 14, 2002

Related U.S. Application Data

(62) Division of application No. 09/404,363, filed on Sep. 24, 1999, now Pat. No. 6,338,192.

(30) Foreign Application Priority Data

Sep. 25, 1998 (JP) .......................... 10-270872

(51) Int. Cl.$^7$ .............................................. B23P 21/00
(52) U.S. Cl. ............................ 29/708; 29/706; 29/741; 74/612
(58) Field of Search .................. 29/740, 741, 706, 29/708; 83/DIG. 1; 192/133, 135; 74/612, 613, 614, 615, 616; 160/187, 201, 203, 210, 218

(56) References Cited

U.S. PATENT DOCUMENTS

| | | |
|---|---|---|
| 1,428,966 A | 10/1922 | Martin .................... 74/616 |
| 1,668,545 A | 5/1928 | Boraks |
| 3,053,070 A | 9/1962 | Bjorck |
| 3,186,256 A | 6/1965 | Reznick .................... 74/615 |
| 3,224,494 A | 12/1965 | Houk .................... 160/213 |
| 3,718,171 A | 2/1973 | Godwin .................... 160/210 |
| 3,798,998 A | 3/1974 | Connors et al. |
| 3,848,721 A | 11/1974 | Smit |
| 3,861,016 A | 1/1975 | Johnson et al. ............ 29/708 |
| 3,876,969 A | 4/1975 | Price, Jr. |
| 3,988,980 A | 11/1976 | Walker |
| 3,996,815 A | 12/1976 | Walker |
| 4,054,064 A | 10/1977 | Walker |
| 4,307,798 A | 12/1981 | Watanabe |
| 4,424,741 A | 1/1984 | Moldestad |
| 4,606,117 A | 8/1986 | Takahashi ................ 29/740 |
| 4,657,158 A | 4/1987 | Faes et al. |
| 4,835,843 A | 6/1989 | Wendt et al. ............. 29/708 |
| 5,035,047 A | 7/1991 | Harigane et al. .......... 29/740 |
| 5,375,587 A | 12/1994 | Ward et al. .............. 160/201 |
| 5,661,239 A | 8/1997 | Takeuchi |

FOREIGN PATENT DOCUMENTS

| | | | |
|---|---|---|---|
| GB | 650409 | 2/1951 | |
| JP | 404017399 | 1/1992 | ................ 29/740 |
| JP | 404120799 | 4/1992 | ................ 29/740 |
| JP | 09046089 | 2/1997 | |

Primary Examiner—David P. Bryant
Assistant Examiner—Steven Blount
(74) Attorney, Agent, or Firm—Wenderoth, Lind & Ponack, L.L.P.

(57) ABSTRACT

The safety device includes an opening/closing cover which isolates a takeout part and an accommodating part of a component feeder unit from each other and which has a sensor for detecting a closed state. The component feeder unit includes the component accommodating part, a feed-out part and the takeout part, and sensors for transmission through voids common to the plurality of set component feeder units. Upon a detection by any one of the sensors during the operation of the machine, the machine is halted. For replacement of the component feeder units, a changeover switch is pressed, by which the detecting function is paused for a specified time period. Thus, a safety device which allows the component feeder units to be replaced even during the operation of the machine can be obtained.

3 Claims, 10 Drawing Sheets

COMPONENT MOUNTING MACHINE AND SAFETY DEVICE THEREOF

This application is a Divisional Application of application Ser. No. 09/404,363, filed Sep. 24, 1999 now U.S. Pat. No. 6,338,192.

BACKGROUND OF THE INVENTION

The present invention relates to a component mounting machine comprising a safety device thereof for securing operators' safety in component mounting machines for mounting components on objects to be mounted, such as boards.

In recent years, component mounting machines have been required to assure a high level of safety for operators, as typified by E.C. standards. As prior art of the safety device for component mounting machines, there have hitherto been known, for example, those shown in FIGS. 8 and 9 showing appearance views of mounting machines. The prior art safety devices for component mounting machines mentioned above are described below with reference to the accompanying drawings.

FIG. 8 shows a conventional component mounting machine having a taped component feed section that can feed taped pickup-target components one by one, and a tray feed section that feeds components arrayed on trays. The mounting machine includes a safety device which is provided for use primarily in Japan.

In FIG. 8, denoted by reference numeral 101 is a side cover of the mounting machine, having an opening 101a for a board transfer unit 102 that transfers and positions the board. There is at the opposite side face a similar cover. Inside the covers, although not shown, a nozzle unit for vacuum-picking up components, an up-and-down drive shaft for moving the nozzle unit up and down, a component transfer head on which the nozzle unit is mounted, and an X-Y robot unit for positioning the component transfer head back and forth, right and left, are driven by a control unit at high speed in order to mount components onto, the board. Numeral 103 denotes a tray component feed section 103 with a cover. Numeral 104 denotes a taped component feed section. In this taped component feed section 104, 105 is a component feeder unit platform, which allows a plurality of component feeder units (not shown) to be set thereon. Denoted by 106 is a cover that covers above the component feeder units, preventing the operator from putting the hand to the inside of the cover from above the component feeder units. Denoted by 107 is a safety fence, showing the operator a safety region. The nozzle unit sucks and takes out a component from the component feeder units set on the platform 105. In this case, when replacement of one of the component feeder units due to an exhaustion of the components in the component feeder unit is required, the platform 105 is moved in a direction of arrow A. This region is a region the nozzle unit cannot reach, allowing the operator to perform the replacement work safely while the mounting machine continues operating.

As another prior art example, FIG. 9 shows a conventional safety device for component mounting machines, which device meets primarily European safety standards. Its difference from the prior art example of FIG. 8 is that the component feed section of the component feeder units is all covered with covers 110, 111. In this case, as in the mounting machine shown in FIG. 8, when replacement of one of the component feeder units is required, it has been conventional practice that the covers 110, 111, or 112 are opened, causing the machine operation to be halted. Upon completion of the replacement work, the cover(s) are closed, causing the machine to begin operation again.

However, the constitutions shown above have had the following issues.

Referencing first the mounting machine of FIG. 8, as described above, when replacement of the component feeder unit is required, the platform 105 is moved in the direction of arrow A. In this case, however, with the opening 107 defined between the platform 105 and the component feeder unit, if the operator has put the hand in the opening 107 beyond the safety fence 106, the operator's safety would be impaired.

The other mounting machine of FIG. 9 has had an issue that because the whole machine including the whole of the component feeder units is covered with the covers, the mounting machine is increased in size, causing an increased installation area of the mounting machine as a whole.

There has been another issue that because opening the cover causes the machine to halt for assurance of the safety, it is impossible, for example, to verify the operating state of the component feeder units while opening the cover, which inevitably makes it impossible to replace the component feeder unit while the machine is kept operating.

SUMMARY OF THE INVENTION

An object of the present invention is therefore to provide a component mounting machine which is capable of solving the above-described issues and which allows the whole machine including the whole of the component feeder units not to be covered with cover(s). Thus, the mounting machine does not need to be increased in size, and an increased installation area of the mounting machine as a whole is not necessary, without impairing the worker's safety.

In accomplishing these and other aspects, according to a first aspect of the present invention, there is provided a component mounting machine which comprises a component feeder unit, a component feed section, a nozzle unit, a robot unit, a control unit, and an opening/closing cover.

The component feeder unit has a component accommodating part for accommodating components, a feed-out part for feeding the accommodated components one by one, and a component takeout part enabled to take out the fed components. The component feed section has a plurality of the component feeder units is set thereon. The nozzle unit takes out the component from the component feed section and mounts the component onto an object to be mounted, and the component accommodating part is set outside a movable range of the nozzle unit. The robot unit drives the nozzle unit, and the control unit controls operations of the nozzle unit and robot unit. The opening/closing cover shuts off (isolates) the component takeout part and the component accommodating part from each other in its close state, and includes an upper cover for swinging on a fulcrum of a machine upper portion, a sub-cover for swinging on a fulcrum of a front end portion of the upper cover, and a guide mechanism for regulating operation of the sub-cover. The guide mechanism regulates movement of the sub-cover when the sub-cover moves together with the upper cover so that the sub-cover does not interfere with a movable part of the nozzle unit. When the component feeder unit is set on the component feed section and the sub-cover is moved to a closed position, the component takeout part of the component feeder unit is covered with the sub-cover while the component accommodating part of the component feeder unit is exposed. Thus, the movable part of the nozzle unit and the component accommodating part of the component feeder unit are isolated so that there is no space through which a foreign object such as the operator's hand can enter to the movable part of the nozzle unit.

According to a second aspect of the present invention, there is provided a component mounting machine according to the first aspect, further comprising an opening/closing cover sensor for detecting the closed state of the opening/closing cover, and a detection sensor for detecting that an operator's hand etc. enters the component feed section. The control unit stops an operation of the component mounting machine when the opening/closing cover sensor detects that the opening/closing cover is not in the closed state thereof or when the detection sensor detects that the operator's hand etc. enters the component feed section.

According to a third aspect of the present invention, there is provided a component mounting machine according to the second aspect, wherein the detection sensor is a sensor for passing detection light through voids common to the plurality of set component feeder units, and for detecting that the operator's hand etc. enters the component feed section due to the detection light being blocked when the operator's hand etc. enters the common voids.

According to a fourth aspect of the present invention, there is provided a component mounting machine according to the second aspect, wherein the detection sensor comprises an up/down sensor and a presence/absence sensor. The up/down sensor passes detection light in an up-and-down direction in the component feeder units set in the component feed section, and detects that the operator's hand etc. enters the component feed section due to blockage of the detection light by the entered operator's hand etc. The presence/absence sensor detects the presence of the component feeder unit. The control unit turns the up/down sensor on when the presence/absence sensor is turned off, turns the up/down sensor off when the presence/absence sensor is turned on, and stops the operation of the component mounting machine when the up/down sensor detects that the operator's hand etc. has entered the component feed section.

According to a fifth aspect of the present invention, there is provided a component mounting machine according to the second aspect, wherein the detection sensor comprises a sensor for detecting that the operator's hand etc. has entered the component feed section by tilting a barshaped detection member down with the entered operator's hand etc. The detection member is tilted down while the component feeder unit is set in the component feed section, and is raised while the component feeder unit is removed so as to detect the entered operator's hand etc.

According to a sixth aspect of the present invention, there is provided a component mounting machine according to any one of the first to fifth aspects, wherein the component feed part has a platform which allows a plurality of the component feeder units to be set thereon, the platform being stationary only during component feed operation.

According to a seventh aspect of the present invention, there is provided a component mounting machine according to any one of the first to sixth aspects, wherein the component feeder unit feeds taped components one by one.

According to an eighth aspect of the present invention, there is provided a component mounting machine according to any one of the first to seventh aspects, further comprising a changeover switch, wherein pressing the changeover switch causes a detecting function of the detection sensor for a specified time period, allowing the component feeder unit to be replaced with another during this time period during an operation of the component mounting machine.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
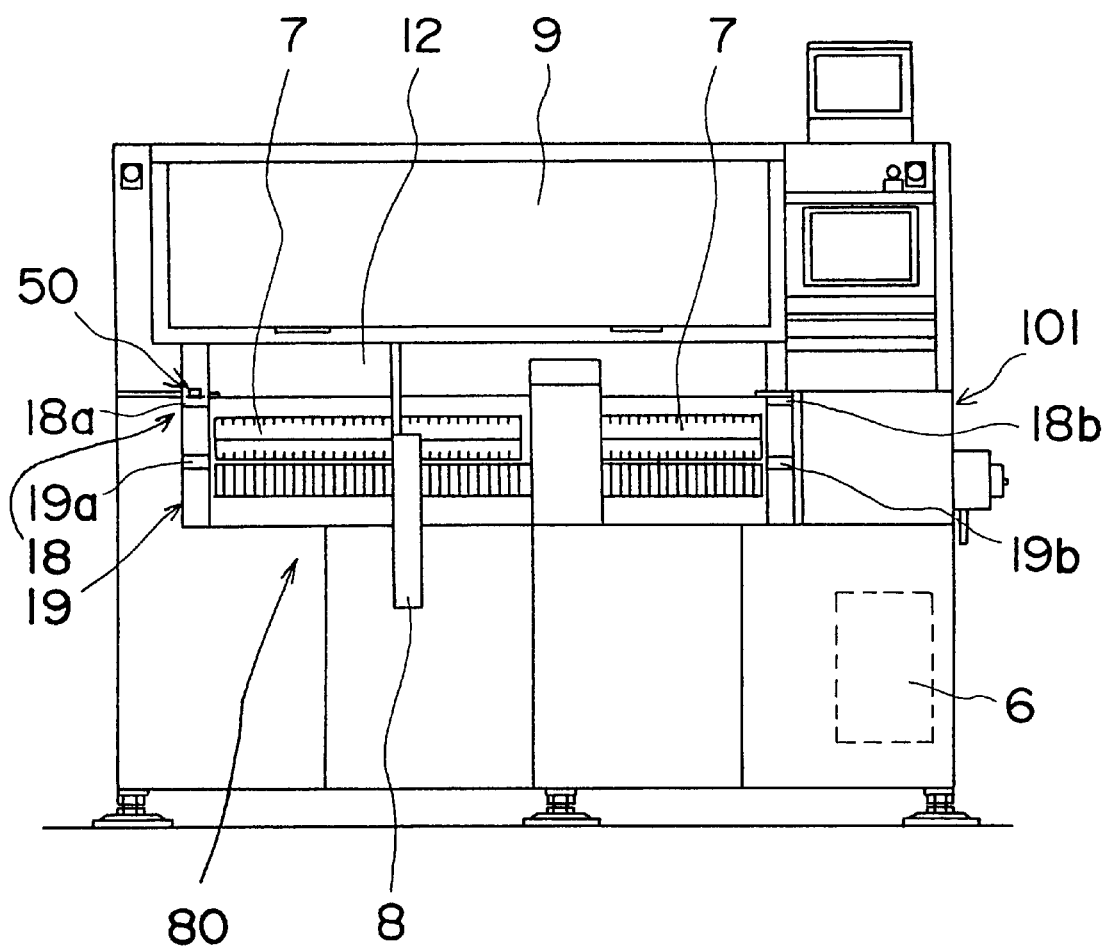
FIG. 1 is a front view showing the whole of a mounting machine having a safety device according to a first embodiment of the present invention.

Before the description of the present invention proceeds, it is to be noted that like parts are designated by like reference numerals throughout the accompanying drawings.

Hereinbelow, embodiments of the safety device for component mounting machines according to the present invention are described with reference to FIGS. 1 to 7.

It is noted that component members having the same functions as those of the prior art are designated by like numerals.

First Embodiment

Figure 2:
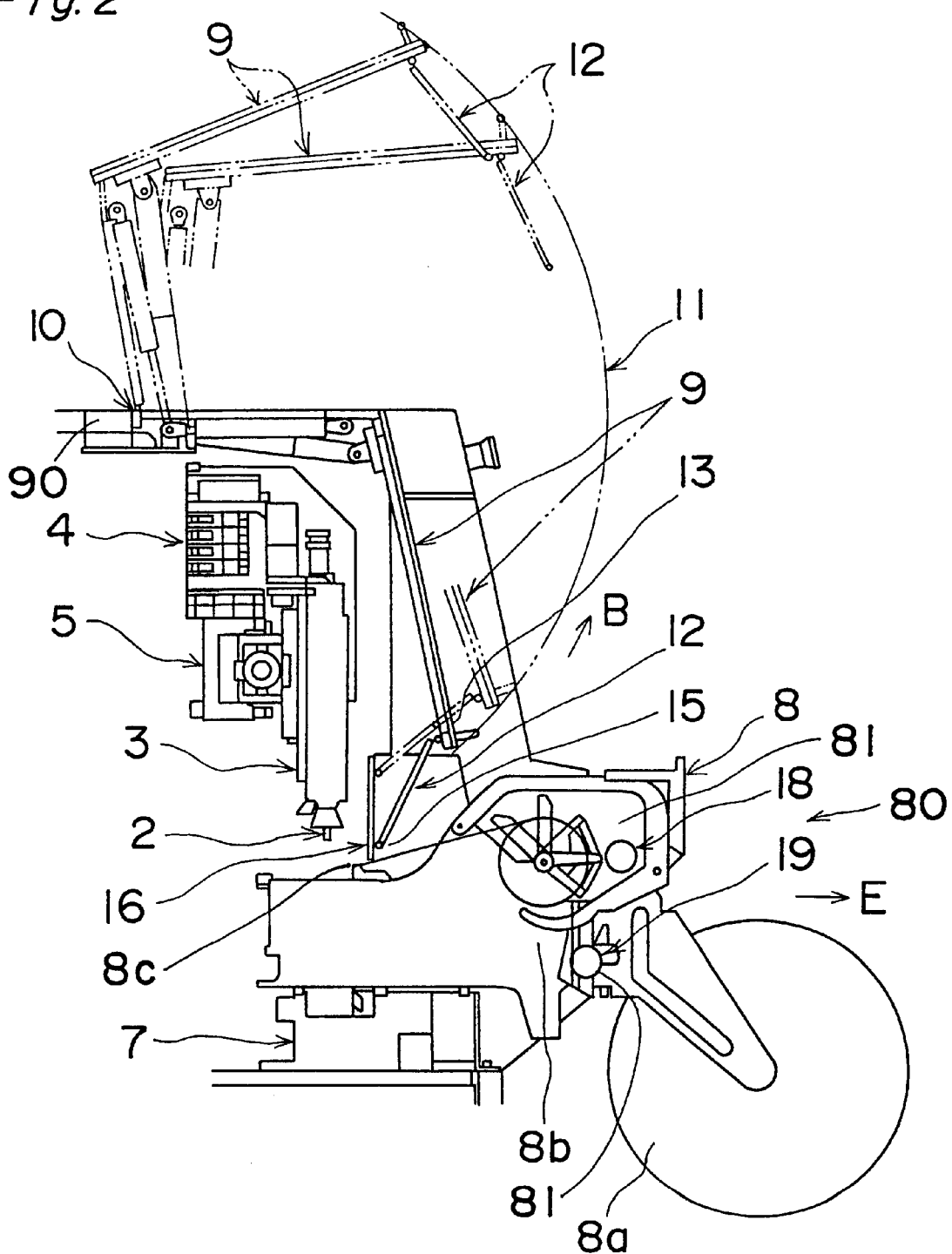
FIG. 2 is a left side view showing a main part of the taped component feed section on the front face side of FIG. 1.

FIG. 1 shows a front view of a mounting machine having the safety device of a first embodiment of the present invention. FIG. 2 is a partial left side view of the taped component feed section serving as one example of a component feed section 80 on the front face side of FIG. 1.

Figure 8:
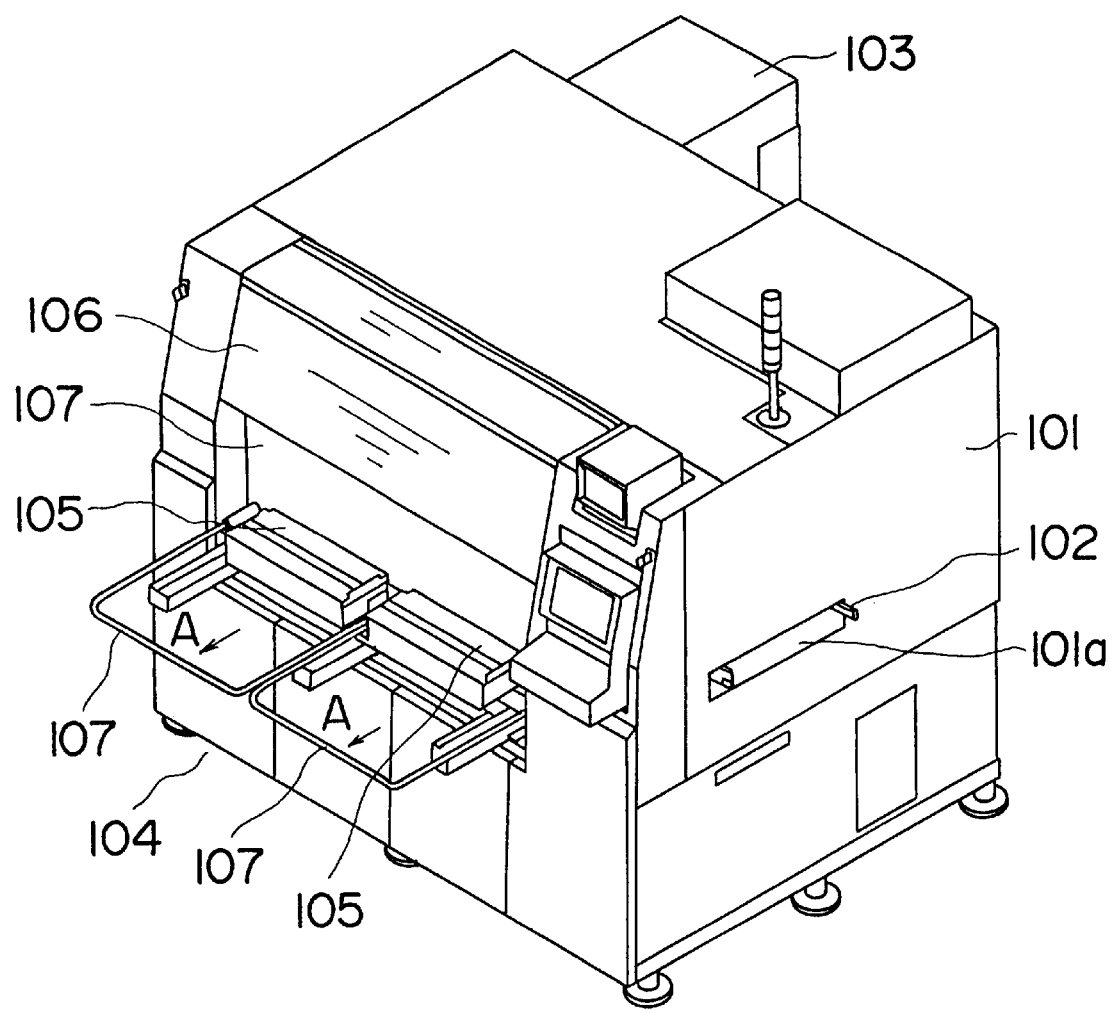
FIG. 8 is a perspective view showing a component mounting machine according to the prior art.
Figure 9:
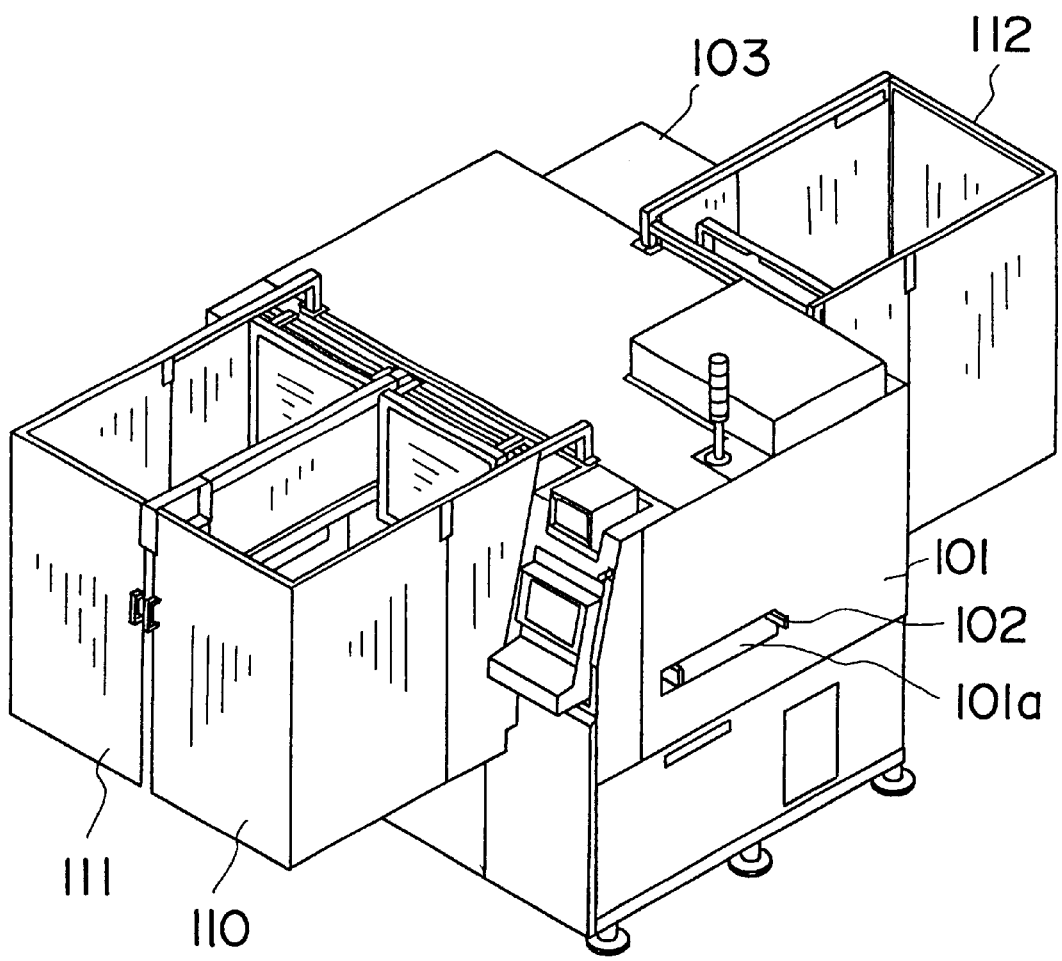
FIG. 9 is a perspective view showing a component mounting machine according to the prior art.

Referring to the figures, reference numeral 101 is a side cover of the mounting machine, which is the same as the side cover of the mounting machines shown in FIGS. 8 and 9 which show conventional mounting machines. This side cover also has an opening for a board transfer unit that transfers and positions a board serving as one example of an object to be mounted. There is at the opposite side face a similar surface cover. Inside the surface covers, a nozzle unit 2 for sucking components for picking-up, an up-and-down drive unit 3 for moving the nozzle unit 2 up and down, a component transfer head 4 on which the nozzle unit 2 is mounted, and an X-Y robot unit 5 for positioning the component transfer head 4 back and forth, right and left, are driven by a control unit 6 for controlling operations of the nozzle unit 2 and the X-Y robot unit 5 at high speed in order to mount components onto the board. As the component feed section 80, although not shown, a tray component feed section and a taped component feed section both covered with tray covers may be provided, as in the prior art examples. In the taped component feed section, numeral 7 is a platform for component feeder units 8, and platform 7 allows a plurality of component feeder units 8 to be set thereon. Reference numeral by 9 denotes an upper cover that covers above the component feeder units 8, and the upper cover 9 swings along a locus 11 about a fulcrum 10. Numeral 12 denotes a sub-cover, which can swing against elastic force of an elastic member such as a torsion coil spring (not shown) about a fulcrum 13 provided at a front end portion of the upper cover 9 on the opposite side of the side of the fulcrum 10. Numeral 15 denotes a roller provided at a front end portion of the sub-cover 12, which roller 15 moves along a guide 16 and swings the sub-cover 12. Therefore, in this embodiment, the opening/closing cover on the front face side of the component mounting machine is constructed by the upper cover 9 and the sub-cover 12.

Figure 10:
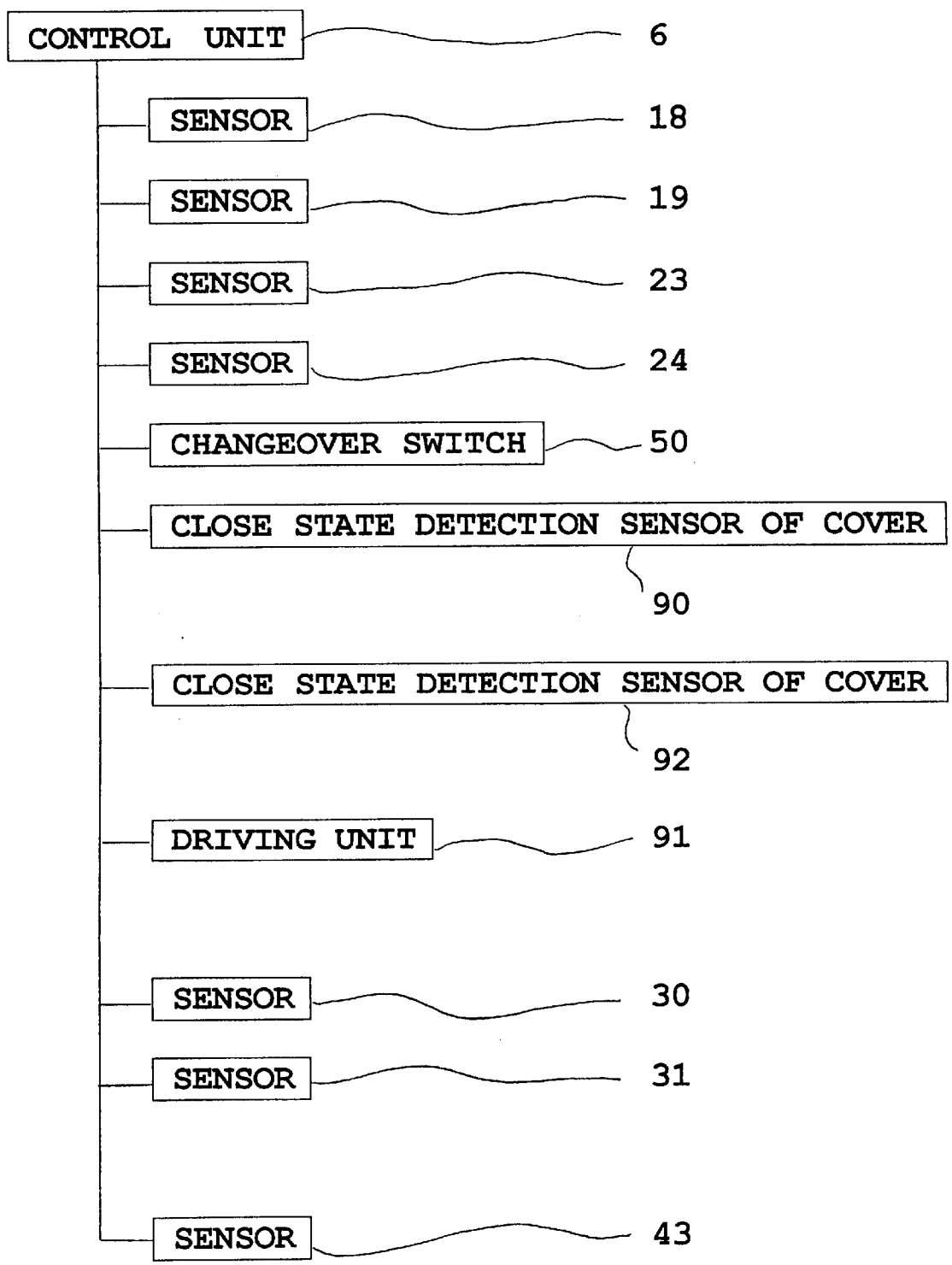
FIG. 10 is a block diagram where a combination of control units of the mounting machines having the safety devices according to the first through third embodiments of the present invention is described, the sensors 30, 31, 43 being omitted in the safety device of the first embodiment, the sensors 18, 19, 23,- 24, 43 being omitted in the safety device of the second embodiment, and the sensors 18, 19, 23, 24, 30, 31 being omitted in the safety device of the third embodiment.

There is provided in the vicinity of the fulcrum 10 of the component mounting machine an opening/closing cover sensor 90 for detecting the closed state of the upper cover 9, serving as one example of an opening/closing cover sensor for detecting the closed state of the opening/closing cover. Then, during the operation of the component mounting machine, when it is detected by the opening/closing cover sensor 90 that the upper cover 9 is not in the closed state, the control unit 6 stops the operation of the component mounting machine. That is, as shown in FIG. 10, the detection of non-closed state of the upper cover 9 by opening/closing cover sensor 90 allows the control unit 6 to stop driving of a driving unit 91 of the component mounting machine so as to stop the operation of the component mounting machine.

The component feeder unit 8 comprises a component accommodating part 8a for accommodating components, a component feed-out part 8b for feeding out the accommodated components one by one, and a component takeout part 8c that can take out the fed components.

The sub-cover 12 covers a portion of the component feeder unit where the nozzle unit 2 takes out a component, i.e., the component takeout part 8c, while the component accommodating part 8a of the component feeder unit 8 is exposed without covering. When the component takeout part 8c is covered with the sub-cover 12 and the component feeder unit 8 set in position, there is no clearance that allows the hand to be put into movable parts of the nozzle unit 2 etc. The nozzle unit 2 sucks and takes out a component from the component feeder unit 8 set on the platform 7. In this case, when a need for replacement of the component feeder unit 8 has arisen from an exhaustion of the components in the component feeder unit 8, the upper cover 9 is pulled up in a direction of arrow B. In this pull-up, the front end portion of the upper cover 9 goes up along the locus 11.

Meanwhile, the sub-cover 12 of the front end portion goes up while swinging in a direction of arrow C, with the roller 15 moving along the guide 16. The sub-cover 12 makes contact with a stopper 17 by the elastic force of a torsion coil spring (not shown) before the roller 15 separates from the guide 16, stopping swinging. In this state, the sub-cover 12 further goes up together with the upper cover 9. This moving locus of the sub-cover 12 regulates the movement of the sub-cover 12 so as to isolate the movable parts of the nozzle unit 2 etc. inside the sub-cover 12 and the component accommodating part 8a of the component feeder units 8 of various configurations. Thus, the movable region and the safety region are shut off from each other by allowing the upper cover 9 and the sub-cover 12 to open and close about the fulcrum 10 and by allowing the sub-cover 12 to enter a limited space when the upper cover 9 and the sub-cover 12 are closed, without interfering with the movable part of the nozzle unit 2 and the component accommodating part 8a of the component feeder units 8. That is, the guide mechanism comprising the roller, the guide 16, and stopper 17 regulates movement of the sub-cover 12 when the sub-cover moves together with the upper cover 9 so that the sub-cover 12 does not interfere with a movable part of the nozzle unit 2. When the component feeder unit 8 is set on the component feed section 80 and the sub-cover 12 is moved to its closed position, the component takeout part 8c of the component feeder unit 8 is covered with the sub-cover 12 while the component accommodating part 8a of the component feeder unit 8 is exposed, thus isolating the movable part of the nozzle unit 2 and the component takeout part 8c of the component feeder unit 8 so that there is no space through which an operator's hand enters into the movable part of the nozzle unit 2.

Numerals 18 and 19 denote transmission sensors, which serve for passing detection light through voids 81 or their proximities of the component feeder units 8 from light-emitting elements 18a, 19a to light-receiving elements 18b, 19b while the component feeder units 8 are set on the platform 7. Each of the sensors 18 and 19 detects that the operator's hand etc. enters the component feed section 8 so as to block the detection light with the part of the operator (for example, the operator's hand, arm, or head) that has entered the common voids 81. The control unit 6 stops an operation of the component mounting machine when it is detected by any one of the sensors 18, 19 that the operator's hand etc. enters the component feed section 8 during the operation of the component mounting machine. That is, as shown in FIG. 10, the detection of the operator's hand etc. by any one of the sensors 18, 19 allows the control unit 6 to stop driving of the driving unit 91 of the component mounting machine so as to stop the operation of the component mounting machine.

In this state, if a full plurality of component feeder units 8 are set, there is only a clearance as small as several mm between the component feeder units 8, so that no clearance exists which allows the operator to put the hand inside the sub-cover 12. In this connection, there may be a case in which several component feeder units 8 are not set. In such a case, a control process is exerted so that an inserted operator's hand, arm, or head would be detected by the sensor 18 or 19 due to blocking of the detection light with the operator's hand, arm, or head, causing the machine to be safely halted.

In addition, the component feeder unit 8 can be removed by pulling it out in a direction of arrow E, and can be installed by pushing it in a direction opposite to the direction of arrow E.

Further, in order to replace the component feeder unit 8 during the operation of the machine, first, a changeover switch 50 is pressed, by which the detection functions of the sensors 18 and 19 are halted for a preset time period. Within this specified time period, the operator is allowed to take out the component feeder unit 8 by making access from outside the cover 9, 12 without halting the machine. After the specified time period has elapsed, the sensor detection function is restored. Then, subsequently, to set a new component feeder unit 8, the changeover switch 50 is pressed again, so that the detection functions of the sensors 18 and 19 are halted only for the specified time period. Within this specified time period, the operator is allowed to set the component feeder unit 8 by making access from outside the cover 9, 12 without halting the machine.

After an elapse of the specified time period, the detection functions of the sensors 18, 19 are automatically restored, so that unforeseen accidents can be prevented. Since the region outside the cover 9 and the sub-cover 12 is a region at which the movable parts such as the nozzle unit 2 cannot be accessed, the replacement work can be achieved safely while the mounting machine is kept operating.

Figure 3:
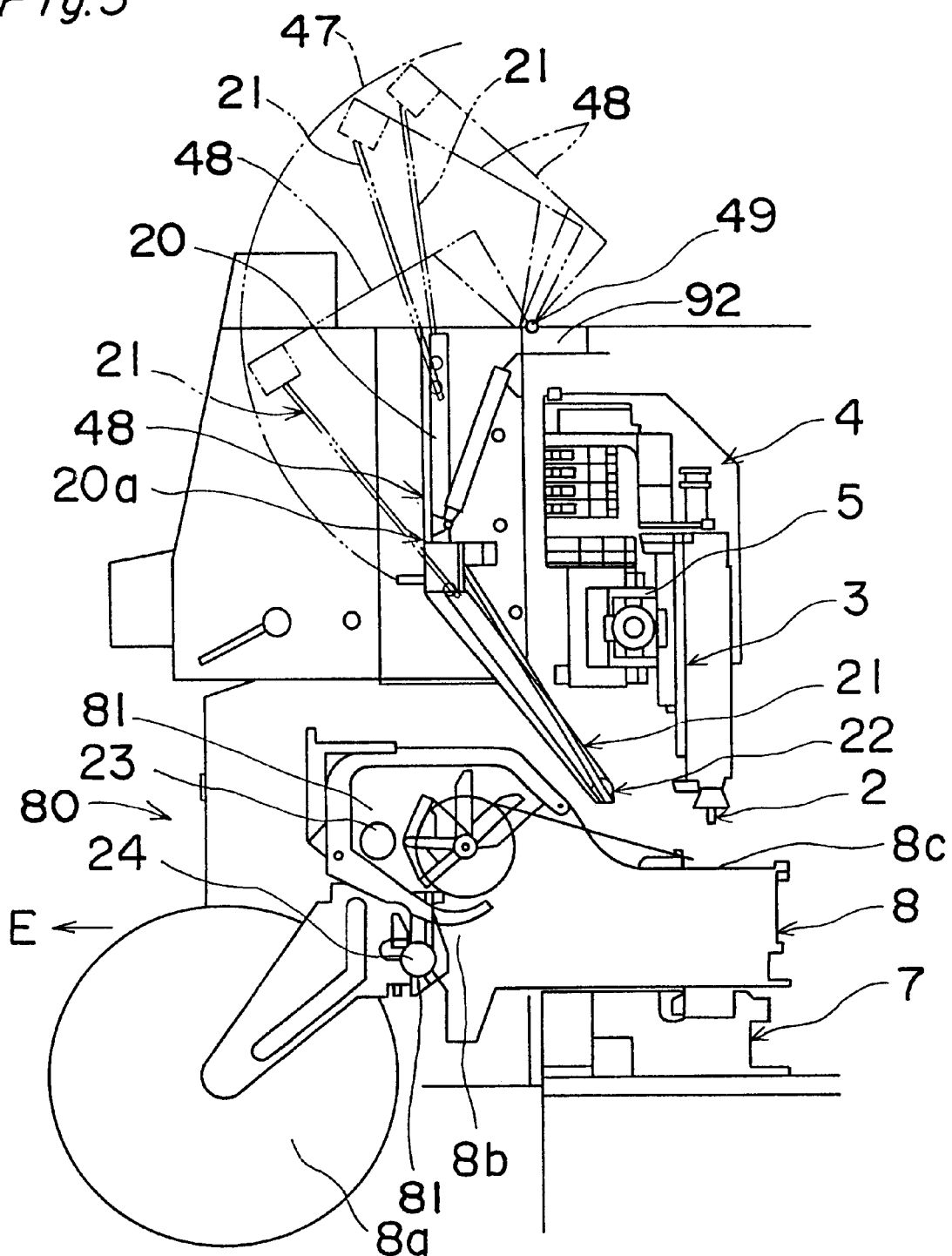
FIG. 3 is a left side view showing a part of the taped component feed section on the rear face side FIG. 1.
Figure 4:
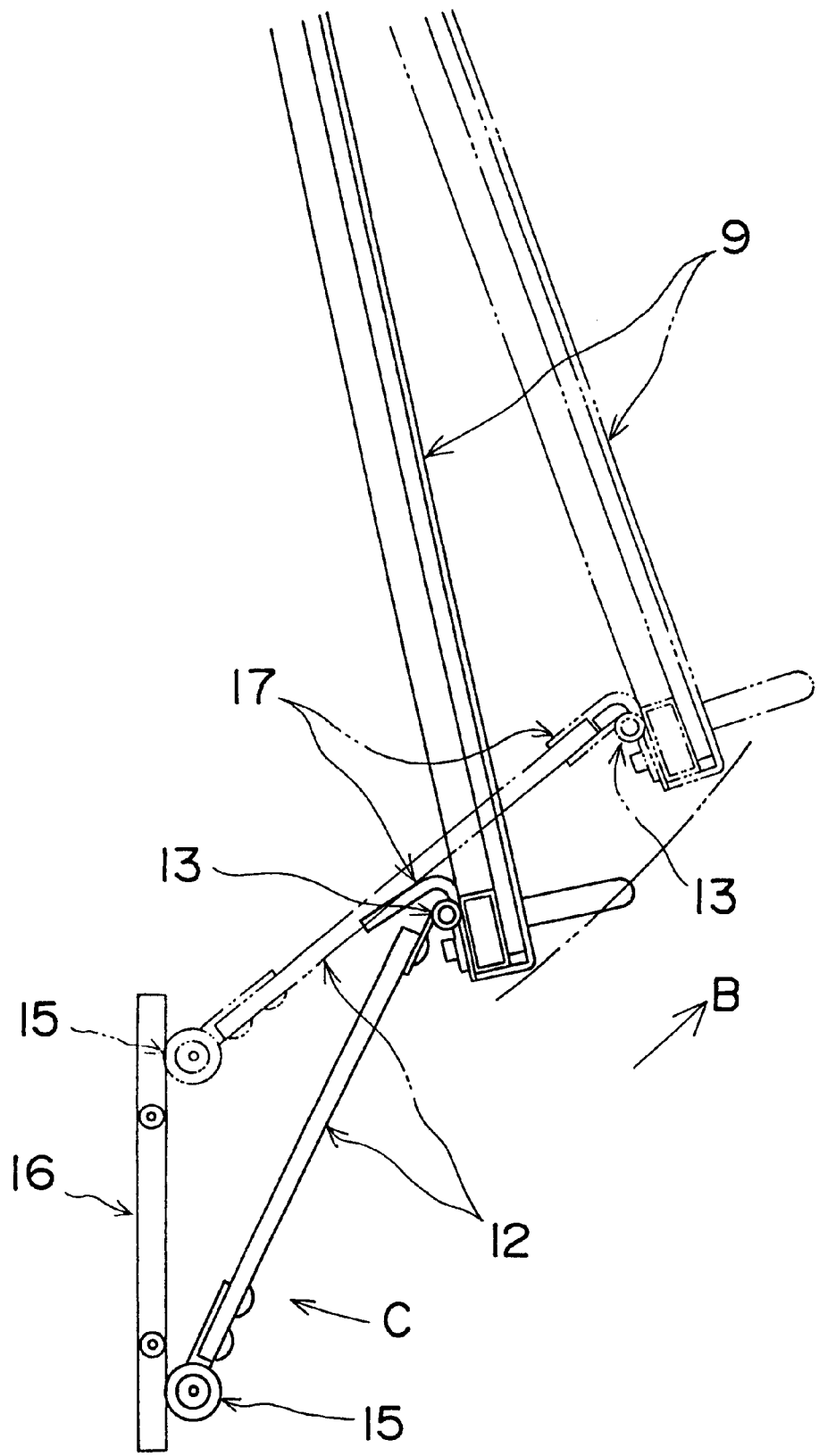
FIG. 4 is a detailed view of a part of FIG. 2.
Figure 5:
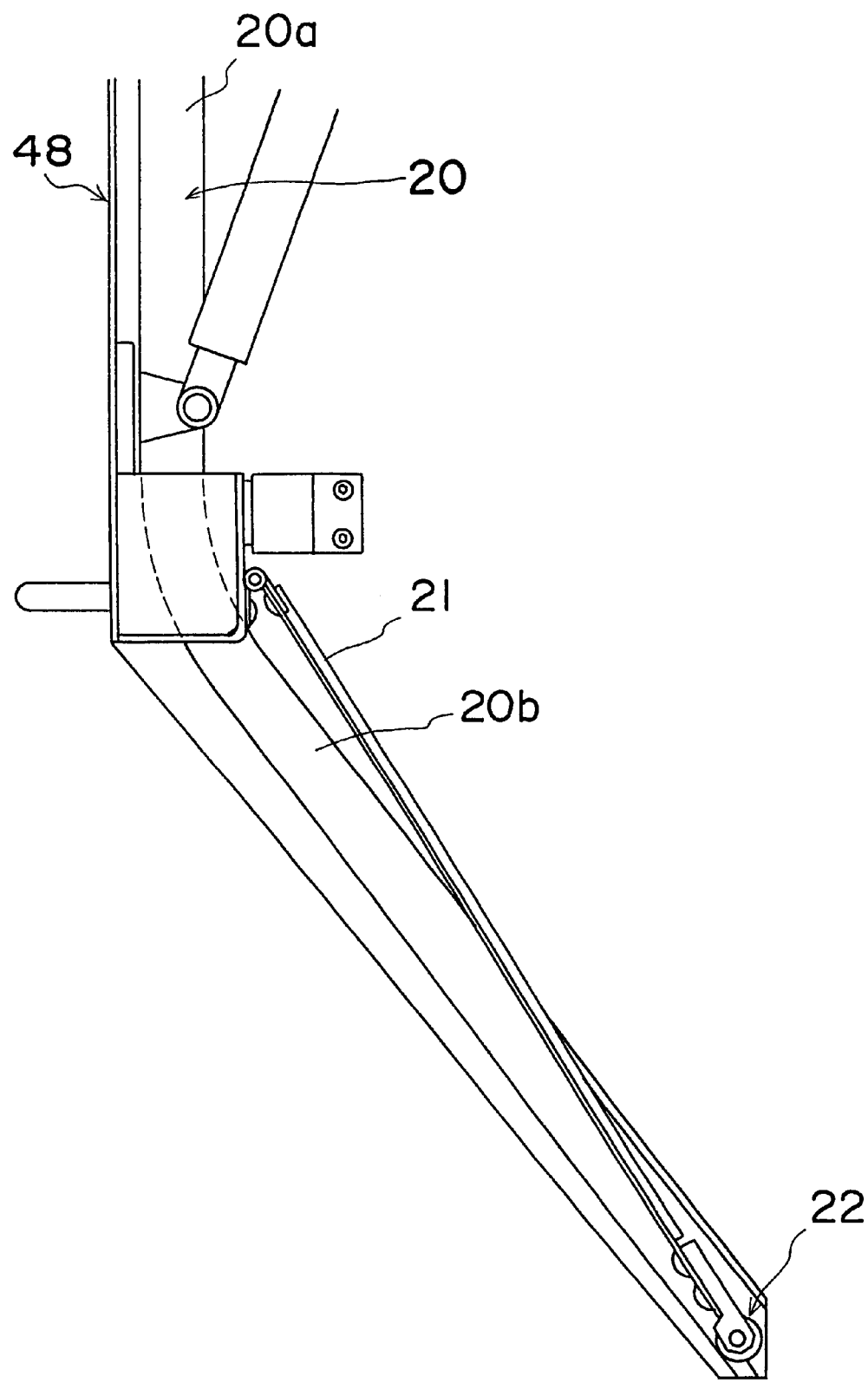
FIG. 5 is detailed view of a part of FIG. 3.

FIG. 3 is a partial left side view of the taped component feed section serving as one example of the component feed section 80 on the rear face side of the machine of FIG. 1. The taped component feed section is generally similar in constitution to the taped component feed section on the front face side of the machine of FIG. 2, but due to the constitution of the head 4, the X-Y robot unit 5 and a solenoid valve or the like forming part of the component transfer head 4 occupy a large space on the side opposite to the nozzle unit 2. Therefore, the movable part and the component feeder unit 8 on the rear face side of the component mounting machine are very close to each other. Due to this, a safe clearance defined by the position of the nozzle unit 2 and the component feeder unit 8 is quite limited. A guide groove 20, which is constituted along this limited space, comprises a vertical portion 20a and a slanted portion 20b. Reference numeral 48 denotes an upper cover for covering an upper part of component feeder units 8 of the taped component feed section on the rear face side of the component mounting machine which swings along a locus 47 about a fulcrum 49. In the vicinity of the fulcrum 49 of the component mounting machine, an opening/closing cover sensor 92 is provided for detecting the closed state of the upper cover 48, serving as one example of an opening/closing cover sensor for detecting the closed state of the opening/closing cover. Reference numeral 21 denotes a sub-cover which can swing against elastic force of an elastic member such as a torsion coil spring (not shown) about a fulcrum 46 provided at a front end portion of the upper cover 48 opposite of the side of the fulcrum 49. A roller 22 provided at the front end of a sub-cover 21 enters the guide groove 20 and moves along this guide groove 20, so that the sub-cover 21 can be swung. Therefore, in the embodiment, the opening/closing cover on the rear face side of the component mounting machine is constructed by the upper cover 48 and the sub-cover 21.

During the operation of the component mounting machine, when it is detected by the opening/closing cover sensor 92 that the upper cover 48 is not in the closed state, the control unit 6 stops the operation of the component mounting machine. That is, as shown in FIG. 10, the detection of non-closed state of the upper cover 48 by opening/closing cover sensor 92 allows the control unit 6 to stop driving of the driving unit 91 of the component mounting machine so as to stop the operation of the component mounting machine.

The upper cover 48 and the sub-cover 21 on the rear face side of the component mounting machine serve similar purposes to the upper cover 9 and the sub-cover 12 on the front face side of the component mounting machine. The guide mechanism on the rear face side of the component mounting machine is constructed by the guide groove 20 and the roller 20 while the guide mechanism on the front face side of the component mounting machine is constructed by the guide 16, the roller 15, and the stopper 17, which are different from each other.

This moving locus of the sub-cover 21 regulates the movement of the sub-cover 21 so as to isolate the movable parts of the nozzle unit 2 etc. inside the sub-cover 21 and the component accommodating part 8a of the component feeder units 8 of various configurations. Thus, the movable region and the safety region are shut off from each other by allowing the upper cover 48 and the sub-cover 21 to open and close about the fulcrum 49 and allowing the sub-cover 21 to enter a limited space when the upper cover 48 and the sub-cover 21 are closed, without interfering with the movable part of the nozzle unit 2 and the component accommodating part 8a of the component feeder units 8.

Also, sensors 23, 24 operate in the same manner as the sensors 18, 19 of the embodiment of FIG. 2.

In addition, although the sensors have been provided two in number as 18, 19 or 23, 24 in the above description, the number of sensors is not limitative and the provision of more voids 81 common to a plurality of component feeder units 8 allows more sensors to be set, in which case it is more difficult for the operator to put in hands, with the safety enhanced.

Furthermore, although one sub-cover is provided in the above description, providing a further sub-cover at the front end portion of the sub-cover allows a cover to be formed up of many planes, so that a cover more suited to the machine configuration can be realized.

Second Embodiment

Figure 6:
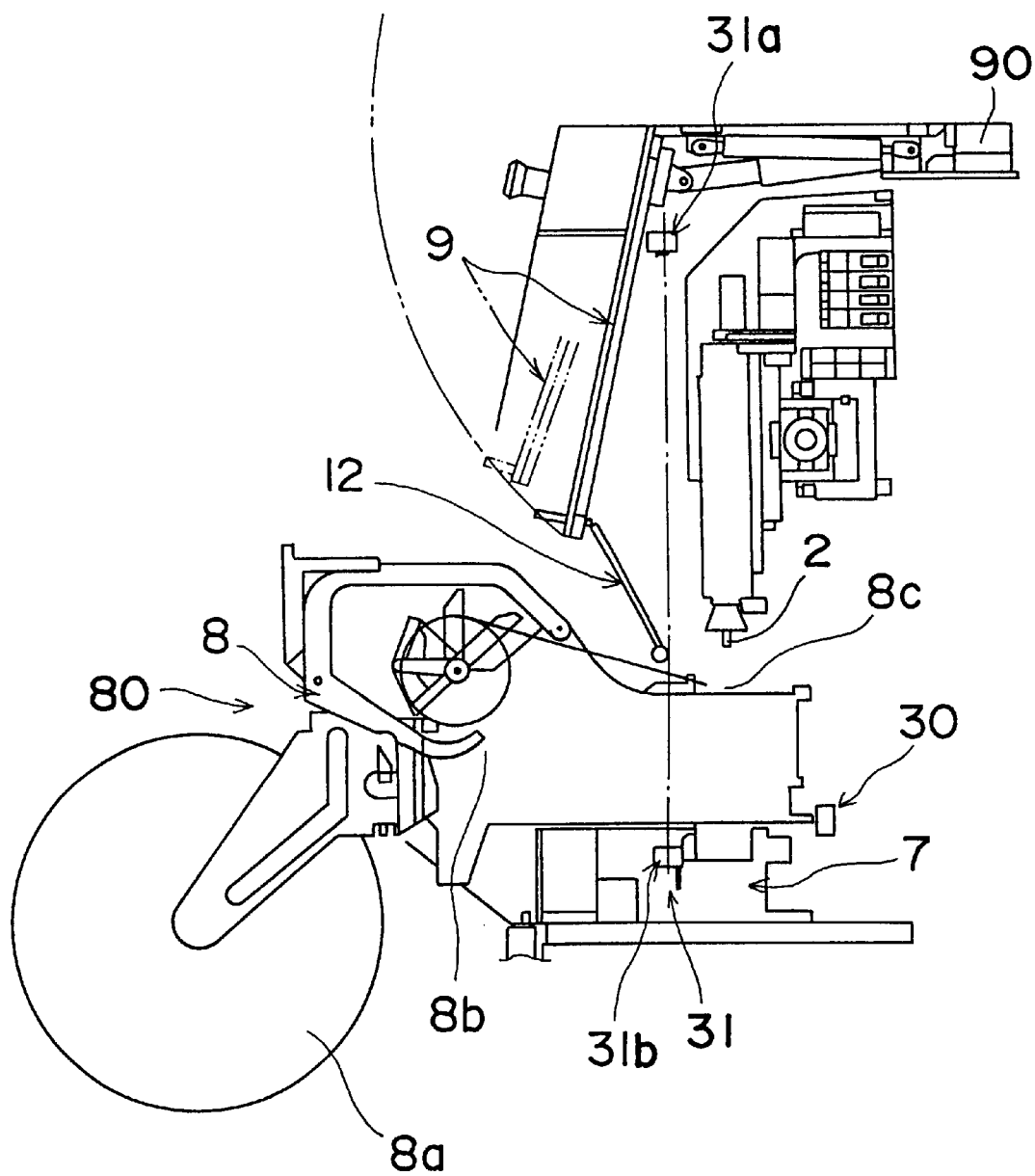
FIG. 6 is a side view showing a mounting machine having a safety device according to a second embodiment of the present invention.

FIG. 6 shows a mounting machine having a safety device of a second embodiment of the present invention.

In FIG. 6, reference numeral 30 denotes a presence/absence sensor for detecting the presence of each component feeder unit 8 when the component feeder unit 8 is set. Reference numeral 31 denotes a transmission up-and-down sensor for passing detection light in an up-and-down direction in the component feeder unit 8 set on the component feed section from a light-emitting element 31a to a light-receiving element 31b. The transmission up-and-down sensor 31 detects that the operator's hand etc. has entered the component feed section and blocked the detection light by the operator's hand etc. in the component feed section. When the presence/absence sensor 30 detects the component feeder unit 8, the control unit 6 allows the detecting function of the presence/absence sensor 31 to be halted. When the presence/absence sensor 30 does not detect the component feeder unit 8, the control unit 6 allows the detecting function of the presence/absence sensor 31 to be operative. Thus, even if the operator tries to put a hand through the clearance where no component feeder units 8 are set, it is detected by the presence/absence sensor 31, so that the machine is safely halted under the control unit 6, making it possible to protect the operator from any unforeseen accidents.

In this case, for replacement of the component feeder unit 8 during the operation of the machine, the component feeder unit 8 can be replaced in the same manner as in the embodiment of FIG. 2, by pressing the changeover switch 50 and then halting the detection operation of the sensors 30, 31 for a preset time period.

In addition, the sensors 30, 31 have been set for each of the component feeder units 8 in the above description. However, in cases where the width of each of the component feeder units 8 is small and even if one or two component feeder units 8 are not set, the operator cannot put a hand through a space where one or two component feeder units 8 are not set, providing the sensors 30, 31 for every two or three component feeder units 8 instead of providing the sensors 30, 31 for each one component feeder unit 8 assures the operator's safety. Further, with small component feeder units 8, providing sensors 30, 31 for every two or three component feeder units 8 can assure the operators' safety, naturally.

Furthermore, although the platform 7 has been provided as a stationary one, it is also possible that the platform 105 on which a plurality of component feeder units are set as in FIG. 8, which shows the prior art example, can be made moveable and be used. The platform can be moved so as to move away from the movable parts such as the nozzle unit, by which the presence/absence sensor 30 is turned off and, after a specified time period elapse, turned on. Therefore, the operator's hand that is put into the movable part is detected and then, the machine is halted under the control unit 6. Also, although the up/down sensor 31 has been set so that the detection light is shielded by the component feeder unit 8, it is also possible that the up/down sensor 31 is provided at a space between the component feeder units 8 if the space is present between the component feeder units 8.

Third Embodiment

Figure 7:
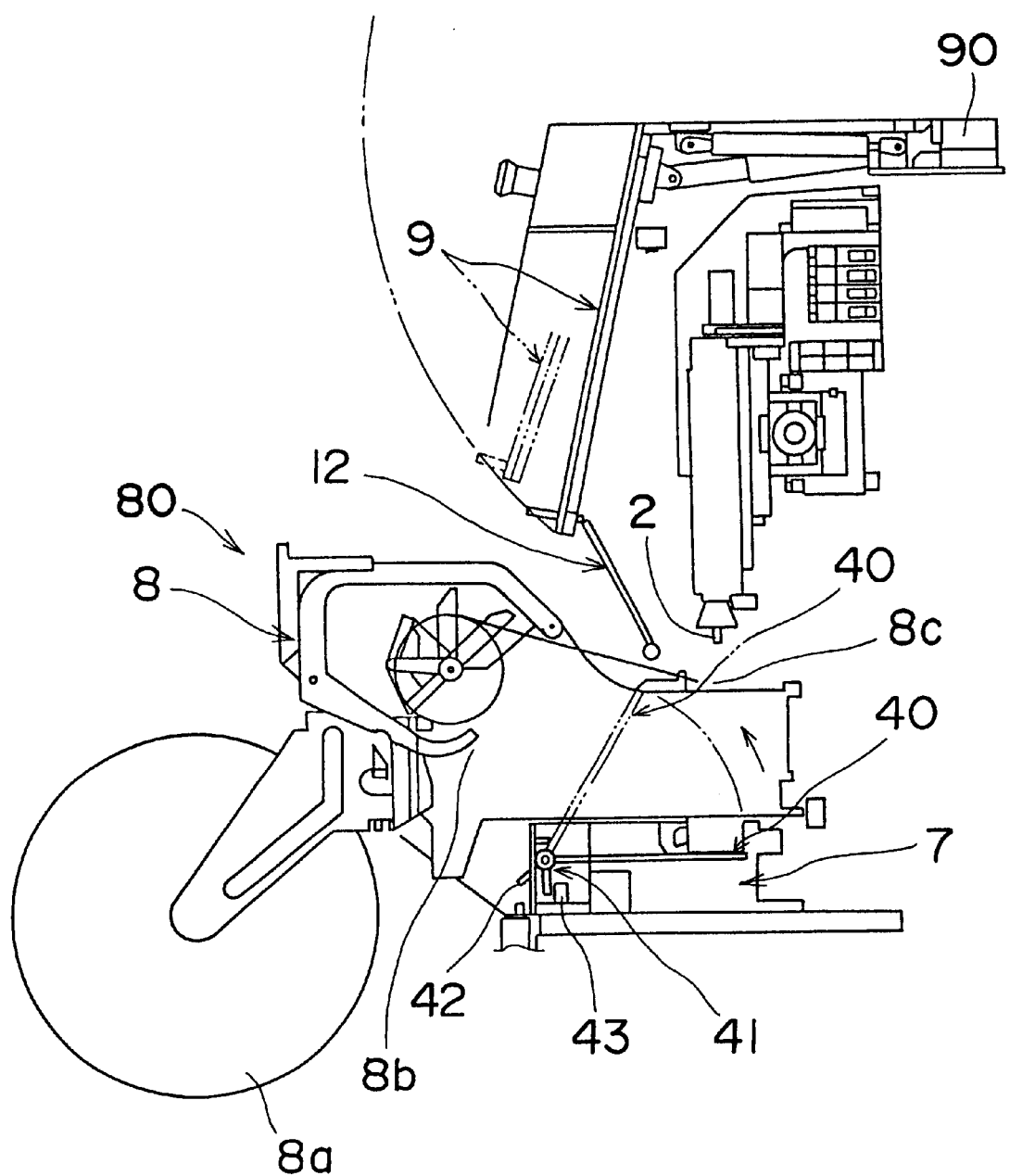
FIG. 7 is a side view showing a mounting machine having a safety device according to a third embodiment of the present invention.

FIG. 7 shows a mounting machine having a safety device of a third embodiment of the present invention.

In FIG. 7, reference numeral 40 denotes a bar which swings about a fulcrum 41 and which serves as one example of a bar-shaped detection member. The bar 40 is set for each component feeder unit 8, and works in such a way that when a component feeder unit 8 is set, the bar 40 is pushed down by the component feeder unit 8. When a component feeder unit 8 is removed, the bar 40 is raised up in a direction of arrow G to a position where the bar 40 makes contact with a stopper 42, by elastic force of a torsion coil spring (not shown) provided at the fulcrum 41, projecting in a space defined by the removed component feeder unit 8. At this time, a sensor 43 is tuned off and detects that the operator's hand has entered the component feed section by tilting the bar 40 down with the entered operator's hand etc. Thus, during the operation of the machine, even if the operator tries to push the bar 40 and tilt the bar 40 down to put the hand inside the sub-cover 12 through the clearance where no component feeder units 8 are set which is defined by the sub-cover 12 and the component feed section, it is detected by the sensor 43, causing the machine to be safely halted under the control unit 6, so that the operator can be protected from unforeseen accidents.

In this case, for replacement of the component feeder unit 8 during the operation of the machine, the component feeder unit 8 can be replaced in the same manner as in the embodiment of FIG. 2, by pressing the changeover switch 50.

In addition, the bar 40 and the sensor 43 have been set for each component feeder unit 8 in the above description. However, in cases where the width of each of the component feeder units 8 is small and even if one or two component feeder units 8 are not set, the operator cannot put a hand through a space where one or two component feeder units 8 are not set. Thus, providing the bar 40 and the sensor 43 for every two or three component feeder units 8 instead of providing the bar 40 and the sensor 43 for each component feeder unit 8 assures the operator's safety. Further, with small component feeder units 8, providing the bar 40 and the sensor 43 for every two or three component feeder units 8 can assure the operator's safety, naturally.

Furthermore, although the platform 7 has been provided as a stationary one, it is also possible that the platform 105 on which a plurality of component feeder units 8 are set as in FIG. 8 which shows the prior art example, can be provided. The platform 105 can be moved so as to move away from the movable parts such as the nozzle unit, by which the bar 40 is raised up so that the sensor 43 is turned on.

As shown above, according to the present invention, the component mounting machine comprises an opening/closing cover for shutting off the component takeout part and the component accommodating part from each other in its close state. The opening/closing cover comprises an upper cover for swinging on a fulcrum of a machine upper portion, a sub-cover for swinging on a fulcrum of a front end portion of the upper cover, and a guide mechanism for regulating operation of the sub-cover. The guide mechanism regulates movement of the sub-cover when the sub-cover moves together with the upper cover so that the sub-cover does not interfere with a movable part of the nozzle unit. When the component feeder unit is set on the component feed section and the sub-cover is moved to a closed position, the component takeout part of the component feeder unit is covered with the sub-cover while the component accommodating part of the component feeder unit is exposed, thus isolating the movable part of the nozzle unit and the component takeout part of the component feeder unit so that there is no space through which an operator's hand enters to the movable part of the nozzle unit.

According to the above construction, the component takeout part of the component feeder unit is covered while the component accommodating part of the component feeder unit is exposed without covering. This arrangement allows the whole machine including all of the component feeder units to not be covered with cover(s), thus not increasing the mounting machine in size, and not causing an increased installation area of the mounting machine as a whole, without impairing the worker's safety. Additionally, since the opening/closing cover configuration can be formed of a plurality of planes and its opening/closing locus can be regulated by the guide mechanism, a soft opening/closing cover suited to the machine configuration can be realized.

Furthermore, the machine may comprise a detection sensor for detecting that an operator's hand has entered the component feed section. The control unit then stops an operation of the component mounting machine when the opening/closing cover sensor detects that the opening/closing cover is not in the closed state thereof or when the detection sensor detects that the operator's hand etc. enters the component feed section.

According to the above construction, even though the component feeder unit is replaced with another, a platform for the component feeder unit is moved to define an opening between the platform and the component feeder unit. Then, an operator puts a hand into the opening during the operation of the machine, the detection sensor detects the entered operator's hand, and the operation of the machine can be halted. Thus, unforeseen accidents can be prevented without impairing the operator's safety.

The detection sensor may comprise a sensor for detecting that the operator's hand etc. has entered the component feed section by tilting a bar-shaped detection member down with the operator's hand etc. The detection member being tilted down with the component feeder unit is set in the component feed section, and is raised with the component feeder unit being removed so as to detect the operator's hand etc.

According to the above construction, when the operator tries to put the hand into the movable part during the machine operation, the operator inevitably has to push away the bar-shaped detection member to put in the hand. Movement of the pushed bar-shaped detection member is detected by the sensor, causing the machine to be immediately halted, so that unforeseen accidents can be prevented.

In the machine, the component feed part may have a platform which allows a plurality of the component feeder units to be set thereon, the platform being stationary only during component feed operation. Thus, even when the replacement of the component feeder unit is carried out with the platform moved, such occurrences as the operator's having tried to put the hand into the movable part during the machine operation can be detected, so that unforeseen accidents can be prevented.

In the machine, the component feeder unit may feed taped components one by one. Thus, the taped components can be set outside the cover, facilitating the replacement or other work.

The machine may further comprise a changeover switch, wherein pressing the changeover switch causes detecting function of the sensor to be paused for a specified time period, allowing the component feeder unit to be replaced with another during this time period. Thus, the safety device has an effect that the component feeder units can be replaced safely even during the machine operation.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A component mounting machine comprising:

a component feeder unit having a component accommodating part for accommodating components, a feed-out part for feeding the accommodated components one by one, and a component takeout part operable to remove the fed components;

a component feed section for supporting a plurality of the component feeder units;

a nozzle unit for removing the component from the component feed section and for mounting the component onto an object to be mounted, wherein the component accommodating part is set outside a movable range of the nozzle unit;

a robot unit for driving the nozzle unit;

a control unit for controlling operations of the nozzle unit and robot unit;

an opening/closing cover for isolating the component takeout part and the component accommodating part from each other in a closed state, the opening/closing cover comprising an upper cover for swinging on a fulcrum of a machine upper portion, a sub-cover for swinging on a fulcrum of a front end portion of the upper cover, and a guide mechanism for regulating operation of the sub-cover;

an opening/closing cover sensor for detecting the closed state of the opening/closing cover; and a detection sensor for detecting when a foreign object has entered the component feed section;

wherein the guide mechanism regulates movement of the sub-cover when the sub-cover moves together with the upper cover so as not to interfere the sub-cover with a movable part of the nozzle unit, and when the component feeder unit is supported on the component feed section and the sub-cover is moved to the closed position, the component takeout part of the component feeder unit is covered with the sub-cover while the component accommodating part of the component feeder is exposed, thus isolating the movable part of the nozzle unit from the component accommodating part of the component feeder unit so that there is no space through which the foreign object can enter the movable part of the nozzle unit;

wherein the control unit stops an operation of the component mounting machine when the opening/closing cover sensor detects that the opening/closing cover is not in the closed state or when the detection sensor detects that the foreign object has entered the component feed section; and wherein the detection sensor comprises a sensor for detecting that the foreign object has entered the component feed section by tilting a bar-shaped detection member down by the foreign object, the detection member being operable to be tilted down with the component feeder unit being supported on the component feed section, and being operable to be raised with the component feeder unit being removed so as to detect the entered foreign object.

2. A component mounting machine as defined in claim 1, wherein the component feed part has a platform which allows a plurality of the component feeder units to be supported thereon, the platform being stationary only during component feed operation.

3. A component mounting machine as defined in claim 1, further comprising a changeover switch, wherein pressing the changeover switch causes detecting function of the detection sensor for a specified time period, allowing the component feeder unit to be replaced with another component feeder unit during an operation of the component mounting machine.

* * * * *